United States Patent
Otani et al.

(10) Patent No.: US 6,483,362 B2
(45) Date of Patent: Nov. 19, 2002

(54) PULSE GENERATOR

(75) Inventors: Akihito Otani; Toshinobu Otsubo, both of Atsugi (JP)

(73) Assignee: Anritsu Corporation, Tokyo (JP)

( * ) Notice: Subject to any disclaimer, the term of this patent is extended or adjusted under 35 U.S.C. 154(b) by 0 days.

(21) Appl. No.: 09/924,330

(22) Filed: Aug. 8, 2001

(65) Prior Publication Data

US 2002/0021160 A1 Feb. 21, 2002

(30) Foreign Application Priority Data

Aug. 10, 2000 (JP) .......................................... 2000-242866

(51) Int. Cl.$^7$ .............................................. H03K 3/017
(52) U.S. Cl. ........................................ 327/172; 327/173
(58) Field of Search ................................. 327/291, 303, 327/184, 172, 175, 173

(56) References Cited

U.S. PATENT DOCUMENTS

| | | | | |
|---|---|---|---|---|
| 5,126,585 A | * | 6/1992 | Boys | 307/45 |
| 5,227,963 A | * | 7/1993 | Schauder | 318/811 |
| 5,434,693 A | | 7/1995 | Tanaka et al. | |
| 5,767,592 A | * | 6/1998 | Boys et al. | 256/10 |

FOREIGN PATENT DOCUMENTS

| | | |
|---|---|---|
| EP | 0 556 974 A2 | 8/1993 |
| EP | 1016891 A1 | 12/1999 |
| JP | 05-283804 | 10/1993 |
| JP | 09-133901 | 5/1997 |
| JP | 2000-187190 | 7/2000 |

OTHER PUBLICATIONS

U.S. Patent Application Ser. No. 09/455,562, filed Dec. 6, 1999; Inventors: Akihito Otani and Toshinubo Otsubo Title: Optical Pulse Generation System for Generating Optical Pulses Having High Duty Ratio.

Official Action in European Application No. 99 124 481.5–2205, dated Jan. 7, 2002.

J. S. Lee et al., "Uniplanar Picosecond Pulse Generator using Step–Recovery diode", Electgronic Letters, IEEE Stevenage, G.B., vol. 37, No. 8, 12, Apr. 2001 (2001–04–12), pp. 504–506, XP006016470, ISSN: 0013–5194, Figures 1, 2.

H. Tanaka et al., "Optical Short Pulse Generation by double gate operation of tandem connected electroabsorption modulators driven by sinusoidal voltages", Electronics Letters, GB, IEEE Stevenage, vol. 29, No. 16, 5 Aug. 1993 (1993–08–05), pp. 1449–1451, XP000388437, ISSN: 0013–5194, page 1450, left–hand column; Figures 1 and 2.

(List continued on next page.)

*Primary Examiner*—Kenneth B. Wells
*Assistant Examiner*—Cassandra Cox
(74) *Attorney, Agent, or Firm*—Frishauf, Holtz, Goodman & Chick, P.C.

(57) ABSTRACT

First and second pulse train generating units each generates first and second pulse trains each having a positive polarity and a negative polarity corresponding to one and other polarity elements among positive and negative polarity elements which configure the electric signal in the sine waveform outputted from a signal generating unit. A phase difference setting unit sets the phase difference between the first and second pulse trains so that a pulse of the first and second pulse trains which are generated by the first and second pulse train generating units are partially superimposed temporally. A wave synthesizing unit synthesizes the first and second pulse trains, in which the phase difference. A half-wave rectifying unit half-wave rectifies the output from the wave synthesizing unit and generates a pulse train having a pulse width narrower than any of the pulse widths owned by the first and second pulse trains.

11 Claims, 6 Drawing Sheets

OTHER PUBLICATIONS

Masatoshi Suzuki: "New Applications of a Sinusoidally Driven INgaasp Electroabsortion Modular to In–Line Optical Gates with ASE Noise Reduction Effect", Journal of Lightwave Technology, U.S., IEEE, New York, vol. 10, NO. 12, 1 Dec. 1992. (1992–12–01), pp. 1912–1918, XP000367892, ISSN: 0733–8724, page 1913, right–hand column; page 1914, left–hand column; page 1915, right–hand column; page 1917, left–hand column; Figures 1–3, 7, 9, 12.

M. Suzuki et al: "10 GBIT/S Optical Demultiplexing and switching by sinusoidally Driven Ingaasp Elecrtoabsorption Modulators", Electronics Letters, GB, IEEE Stevenage, vol. 28, No. 10, 7 May 1992 (1992–05–07), pp. 934–935, XP000305472, ISSN: 0013–5194; entire document.

* cited by examiner

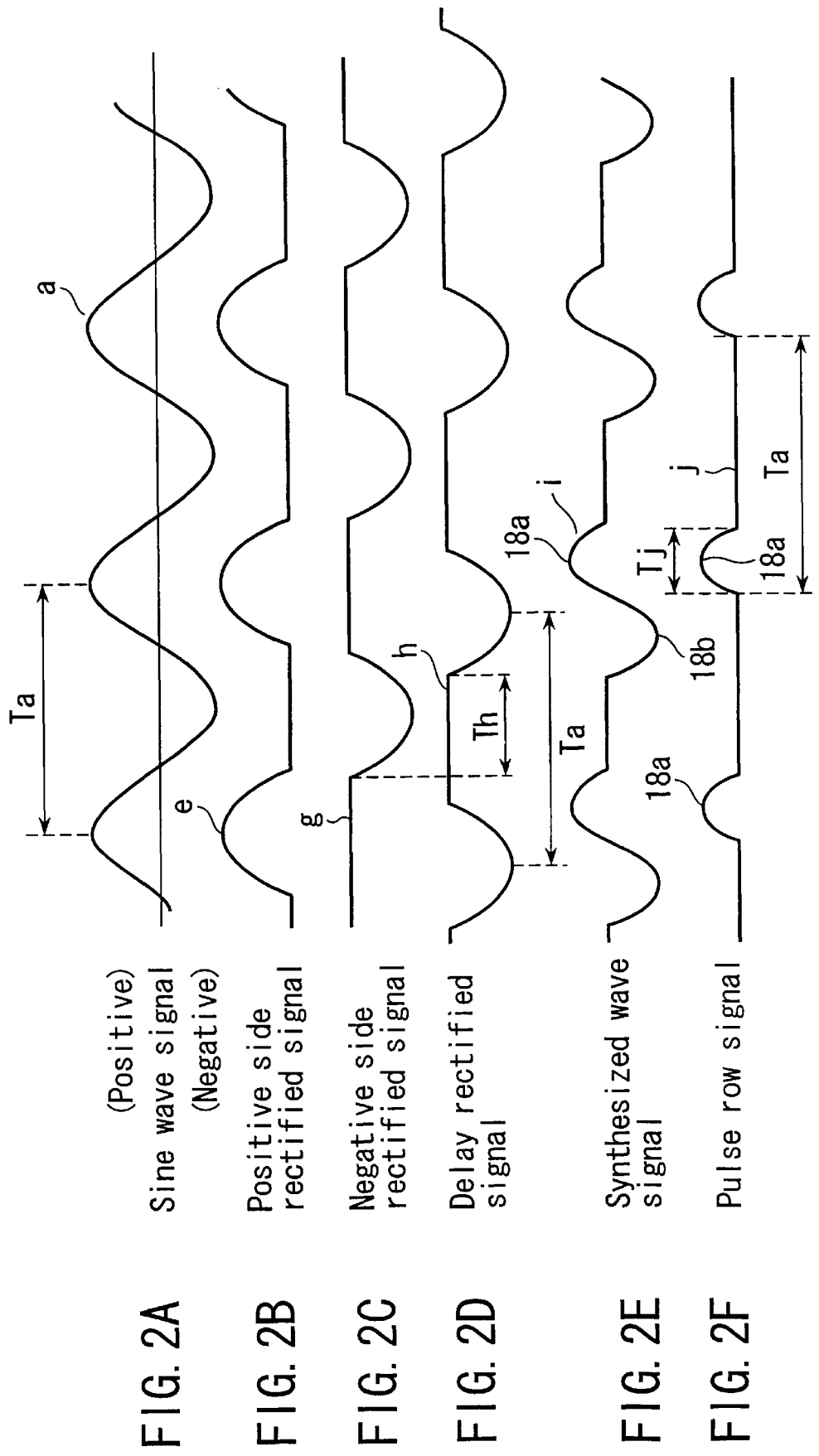

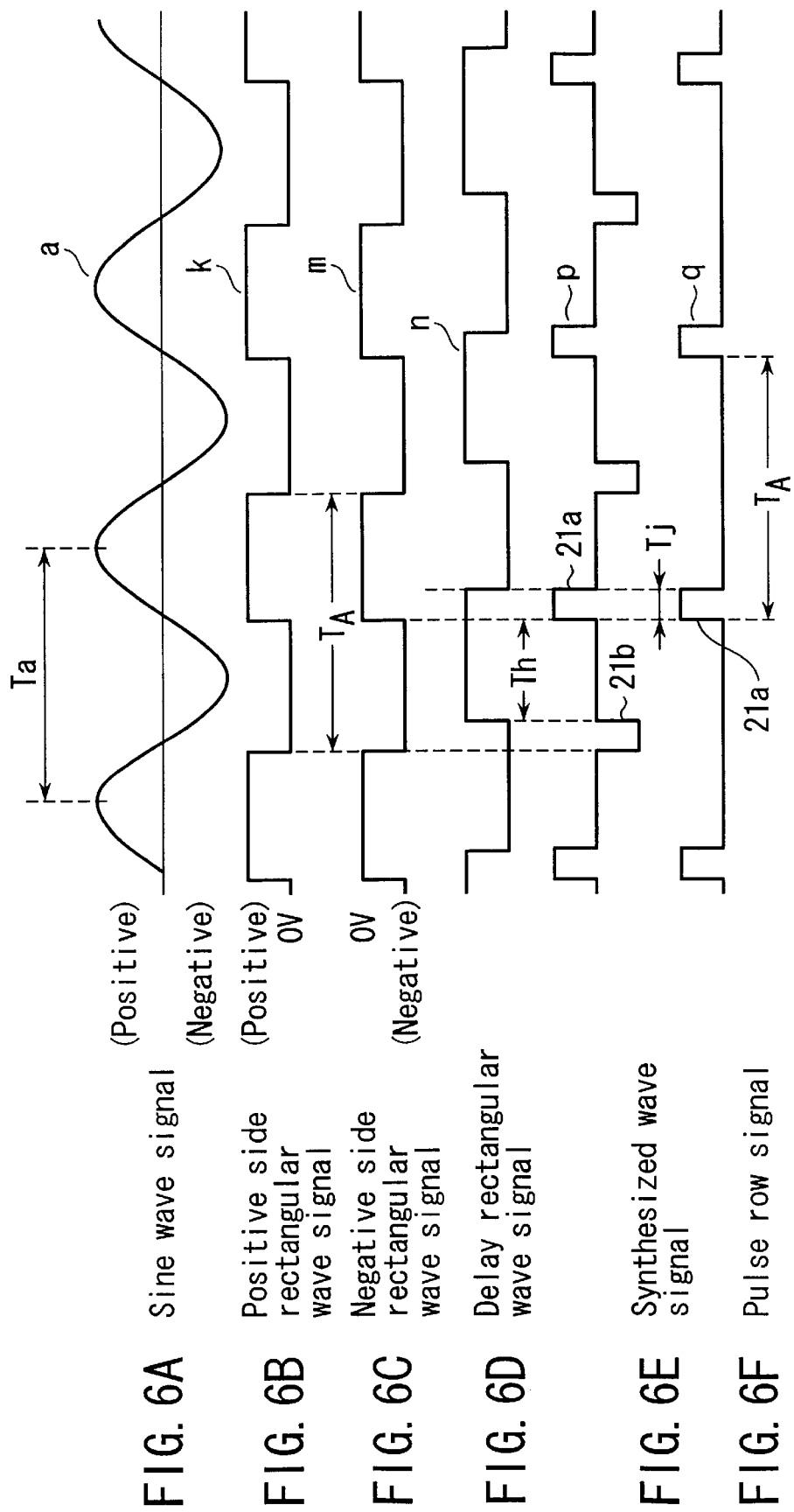

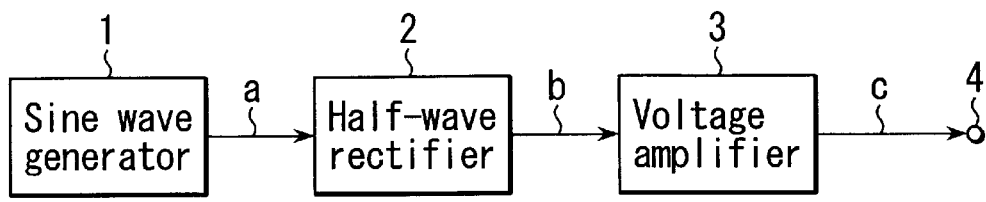
FIG. 10A
(PRIOR ART)
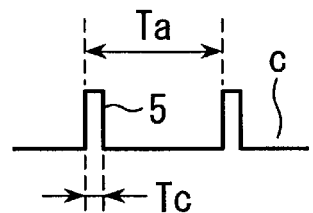
FIG. 10B
(PRIOR ART)
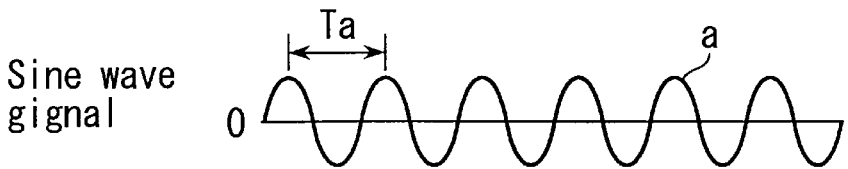
FIG. 11A (PRIOR ART)    Sine wave signal
FIG. 11B (PRIOR ART)    Half-wave rectified signal
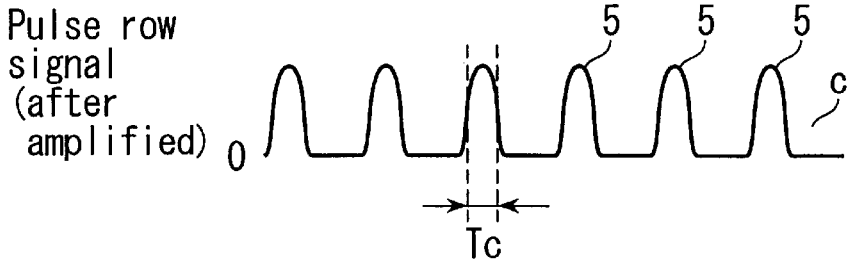
FIG. 11C (PRIOR ART)    Pulse row signal (after amplified)

PULSE GENERATOR

CROSS-REFERENCE TO RELATED APPLICATIONS

This application is based upon and claims the benefit of priority from the prior Japanese Patent Application No. 2000-242866, filed Aug. 10, 2000, the entire contents of which are incorporated herein by reference.

BACKGROUND OF THE INVENTION

1. Field of the Invention

The present invention relates to a pulse generator, particularly relates to a pulse generator for generating a pulse train having a high repeat frequency and a high duty ratio.

2. Description of the Related Art

As is generally known, it is necessary for a pulse train which is used as a driving signal for a DEMUX apparatus, a short pulse light source and a super speed finder or the like, to have a high duty ratio having a high repeat frequency in the range from several GHz to 10 GHz with a narrow pulse width in the range from 10 ps (pico second) to 15 ps (not less than 60 GHz in frequency), for example.

Under a contemporary level of technology, the highest frequency capable of being stably oscillated by an oscillator which is configured by an electric circuit, is about 40 GHz.

Accordingly, it was not possible for one pulse generator to generate a pulse train having the high duty ratio having a high repeat frequency in the range from several GHz to 10 GHz with a narrow pulse width in the range from 10 ps to 15 ps.

Therefore, a pulse generator shown in FIG. 10A is recommended (Jpn. Pat. Appln. KOKAI Publication No. 2000-187190).

In other words, in the pulse generator shown in FIG. 10A, a sine wave generator 1 outputs a sine wave signal "a" with a frequency fA in the range from several GHz to 10 GHz (a period Ta) as shown in FIG. 11A and transmits it to a half-wave rectifier 2.

This half wave rectifier 2 half-wave rectifies the inputted sine wave signal "a" and transmits it to a next voltage amplifier 3 as a half-wave rectified signal b having a waveform as shown in FIG. 11B.

This voltage amplifier 3 amplifies the half-wave rectified signal b to output the half-wave rectified signal after being amplified, namely, a pulse train signal c as shown in FIG. 11C to an output terminal 4.

In the pulse generator which is configured in this manner, the pulse train signal c outputted from the output terminal 4 has a repeat frequency fA (repeat period Ta) as shown in FIG. 10B and can decrease pulse widths Tc of the respective pulses 5 composing this pulse train signal c to about ½ of the repeat period Ta.

Additionally, the pulse generator composed in this manner can decrease amount of a jitter generation of the respective pulses 5.

Further, other pulse generator shown in FIG. 12 is also recommended in the above document (Jpn. Pat. Appln. KOKAI Publication No. 2000-187190).

In other words, in this pulse generator shown in FIG. 12, for example, the sine wave generator 1 outputs the sine wave signal "a" with a frequency fA in the range from several GHz to 10 GHz (a period Ta) and transmits it to a voltage amplifier 3a having a movable operating point.

As shown in FIGS. 13A and 13B, upon amplifying the inputted sine wave signal "a", this voltage amplifier 3a having a movable operating point can arbitrarily set an operation point (bias point) with respect to the inputted sine wave signal "a" by changing a signal value of a operation point control signal which is inputted from the outside.

In FIG. 13A, the operating point (bias point) is set at a position at 0V of the inputted sine wave signal "a".

In this case, the amplified sine wave signal becomes a normal sine wave signal waveform in which a component in a (−) side and a component in a (+) side are substantially symmetric.

However, in this pulse generator, as shown in FIG. 13B, the operating point of the sine wave signal "a" is set with being moved to a negative side.

Accordingly, the sine wave signal amplified by this voltage amplifier 3a has a waveform shape, of which a portion of the (−) side component is clipped.

As a result, a signal waveform of the sine wave signal which is amplified by this voltage amplifier 3a approximates the signal waveform of the amplified half-wave rectified waveform signal c shown in FIG. 11B in the aforementioned pulse generator shown in FIG. 10A.

In the case that the amplitude value (P–P) of the amplified signal is fixed, as described above, the amplified sine wave signal, namely, the respective pulses 5 of a pulse train signal c1 to be outputted to an output terminal 4 from the voltage amplifier 3a have a more sharp peak waveform.

Therefore, by using the voltage amplifier 3a having a movable operating point, it is possible to obtain the pulse train signal c1 having a high duty ratio with a high repeat frequency in the range from several GHz to 10 GHz and a narrow pulse width under the state that the jitter generating amount is restrained.

However, even in the pulse generators of two types as shown in FIGS. 10A and 12A, there are problems to be solved as follows.

At first, as shown in FIGS. 11A, 11B, 11C, 13A and 13B, the pulse widths Tc of the respective pulses 5 composing the pulse train signals c and c1 to be outputted from these pulse generators are substantially determined in response to the repeat frequency Ta of the sine wave signal "a", so that this involves a problem that it is not possible to set the pulse widths Tc of the respective pulses 5 to an arbitrary value.

Further, the pulse widths Tc of the respective pulses 5 are limited to about ½ of the repeat period Ta of the sine wave signal "a", so that this involves a problem that it is not possible to obtain the high duty ratio in the pulse train signals c and c1.

Further, the pulse widths Tc of the respective pulses 5 in the pulse train signals c and c1 are limited to the frequency properties of the amplifiers 3 and 3a.

In other words, in order to amplify the sine wave signal "a" which is outputted from the sine wave generator 1, it is needed to have a higher frequency property than a frequency component of the frequency fA on this sine wave signal "a".

However, the highest frequency of the frequency properties of the amplifiers 3 and 3a are about 40 GHz similar to the sine wave generator 1.

Accordingly, for example, this involves a problem that it is not easy to obtain the extremely high duty ratio such that, for example, the pulse width of the pulse 5 is in the range from 10 ps to 15 ps or the like.

Additionally, the pulse train signals c and c1 which occur resulting from the difference of the frequency properties in the respective amplifiers 3 and 3*a* involve a problem that scattering occurs between the pulse generators each other.

BRIEF SUMMARY OF THE INVENTION

The present invention has been made by taking the above problems into consideration, and it is an object of the present invention to provide a pulse generator of a simple structure capable of generating a pulse train having a high repeat frequency and a high duty ratio by making a pair of pulse trains, of which polarities are different each other, from one electric signal in a sine waveform and regulating the phase difference between these pulse trains each other.

(1) In order to attain the above object, the present invention provides a pulse generator comprising: signal generating means (11) for generating an electric signal in a sine waveform;

first pulse train generating means (12, 19, 22, 24) for generating a first pulse train having a positive polarity corresponding to the positive polarity element among a positive polarity element and a negative polarity element which configure the electric signal in the sine waveform outputted from the signal generating means;

second pulse train generating means (13, 20, 22, 23, 24) for generating a second pulse train having a negative polarity corresponding to the negative polarity element among a positive polarity element and a negative polarity element which configure the electric signal in the sine waveform outputted from the signal generating means;

phase difference setting means (14) for setting the phase difference between the first pulse train and the second pulse train so that a pulse of the first pulse train which is generated by the first pulse train generating means and a pulse of the second pulse train which is generated by the second pulse train generating means are partially superimposed temporally;

wave synthesizing means (15) for synthesizing the first pulse train and the second pulse train in which the phase difference is set by the phase difference setting means; and half-wave rectifying means (16) for half-wave rectifying the output from the wave synthesizing means and generating a pulse train having a pulse width, narrower than any of the pulse widths owned by the first pulse train and the second pulse train.

(2) Further, in order to attain the above object, the present invention provides a pulse generator according to (1), wherein the first pulse train generating means includes a positive half-wave rectifying circuit for half-wave rectifying only a positive pole in a sine wave signal which is outputted from the signal generating means, and outputting a positive side rectified signal as the first pulse train; and the second pulse train generating means includes a negative half-wave rectifying circuit for half-wave rectifying only a negative pole in a sine wave signal which is outputted from the signal generating means, and outputting a negative side rectified signal as the second pulse train.

(3) Additionally, in order to attain the above object, the present invention provides a pulse generator according to (2), wherein the phase difference setting means includes a delay circuit which is inserted in a rear stage of the negative half-wave rectifying circuit, and the delay circuit delays the negative side rectified signal which is outputted from the negative half-wave rectifying circuit by the delay time designated from the outside.

(4) Further, in order to attain the above object, the present invention provides a pulse generator according to (2), wherein the phase difference setting means includes a delay circuit which is inserted in a front stage of the negative half-wave rectifying circuit, and the delay circuit delays the sine wave signal which is outputted from the signal generating means by the delay time designated from the outside to provide it to the negative half-wave rectifying circuit for outputting a negative side rectified signal as the second pulse train.

(5) Further, in order to attain the above object, the present invention provides a pulse generator according to (1), wherein the first pulse train generating means includes a positive rectangular wave generating circuit for outputting a positive side rectangular wave signal as the first pulse train having a positive predetermined value only for a positive pole portion in a sine wave signal which is outputted from the signal generating means; and the second pulse train generating means includes a negative rectangular wave generating circuit for outputting a negative side rectangular wave signal as the second pulse train having a positive predetermined value only for a negative pole portion in a sine wave signal which is outputted from the signal generating means.

(6) Additionally, in order to attain the above object, the present invention provides a pulse generator according to (5), wherein the phase difference setting means includes a delay circuit which is inserted in a rear stage of the negative rectangular wave generating circuit, and the delay circuit delays the negative side rectified signal which is outputted from the negative rectangular wave generating circuit by the delay time designated from the outside.

(7) Further, in order to attain the above object, the present invention provides a pulse generator according to (5), wherein the phase difference setting means includes a delay circuit which is inserted in a front stage of the negative rectangular wave generating an circuit, and the delay circuit delays the sine wave signal which is outputted from the signal generating means by the delay time designated from the outside to provide it to the negative rectangular wave generating circuit for outputting a negative side rectangular wave signal as the second pulse train.

(8) Further, in order to attain the above object, the present invention provides a pulse generator according to (1), wherein the first pulse train generating means includes a half-wave rectifying circuit for half-wave rectifying only a positive pole in the sine wave signal which is outputted from the signal generating means, and outputting a positive side rectified signal as the first pulse train; and the second pulse train generating means includes a polarity reversing circuit for reversing a polarity of the positive side rectified signal which is outputted from the half-wave rectifying circuit, and outputting a negative side rectified signal as the second pulse train.

(9) Additionally, in order to attain the above object, the present invention provides a pulse generator according to (8), wherein the phase difference setting means includes a delay circuit which is inserted in a front stage of the polarity reversing circuit, and the delay circuit delays the positive side rectified signal which is outputted from the half-wave rectifying circuit by the delay time designated from the outside to provide it to the polarity reversing circuit for outputting a negative side rectified signal as the second pulse train.

(10) Further, in order to attain the above object, the present invention provides a pulse generator according to (1), wherein the first pulse train generating means includes a rectangular wave generating circuit for outputting a positive side rectangular wave signal as the first pulse train having a positive predetermined value only for a positive pole portion in the sine wave signal which is outputted from the signal generating means; and the second pulse train generating means includes a polarity reversing circuit for reversing a polarity of the positive side rectangular wave signal which is outputted from the rectangular wave generating circuit, and outputting a negative side rectangular wave signal as the second pulse train.

(11) Further, in order to attain the above object, the present invention provides a pulse generator according to (10), wherein the phase difference setting means includes a delay circuit which is inserted in a front stage of the rectangular wave generating circuit, and the delay circuit delays the positive side rectangular wave signal which is outputted from the rectangular wave generating circuit, by the delay time designated from the outside to provide it to the polarity reversing circuit for outputting a negative side rectangular wave signal as the second pulse train.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 2A, 2B, 2C, 2D, 2E and 2F are timing charts for explaining the operation of the pulse generator according to the first embodiment of the present invention;

FIGS. 6A, 6B, 6C, 6D, 6E and 6F are timing charts for explaining the operation of the pulse generator according to the third embodiment of the present invention;

FIGS. 10A and 10B are a block diagram for illustrating a schematic structure of a conventional pulse generator and a diagram for illustrating its waveform, respectively;

FIGS. 11A, 11B and 11C are timing charts for explaining the operation of the conventional pulse generator shown in FIG. 10A;

DETAILED DESCRIPTION OF THE INVENTION

Figure 1:
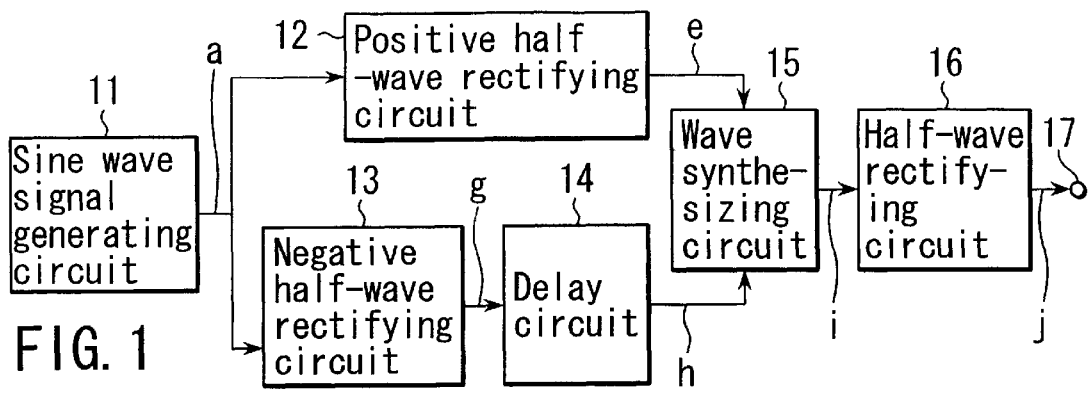
FIG. 1 is a block diagram for illustrating a schematic structure of a pulse generator according to a first embodiment of the present invention.

Reference will now be made in detail to the presently preferred embodiments of the invention as illustrated in the accompanying drawings, in which like reference numerals designate like or corresponding parts.

The respective embodiments of the present invention will be explained below.

First Embodiment

FIG. 1 is a block diagram for illustrating a schematic structure of a pulse generator according to a first embodiment of the present invention.

In other words, in the pulse generator as shown in FIG. 1, a sine wave signal generating circuit 1 generates a sine wave signal "a" as an electric signal of a sine wave having, for example, a frequency fA (a period Ta) in the range from several GHz to 10 GHz as shown in FIG. 2A.

The sine wave signal "a" which is outputted from this sine wave signal generating circuit 1 is inputted in a positive half-wave rectifying circuit 12 and a negative half-wave rectifying circuit 13.

In this case, the positive half-wave rectifying circuit 12 half-wave rectifies only a positive pole in the sine wave signal "a" as shown in FIG. 2A and outputs a positive side rectified signal e as a first pulse train as shown in FIG. 2B.

The positive side rectified signal e which is outputted from this positive half-wave rectifying circuit 12, is applied to one input terminal of a wave synthesizing circuit 15.

On the other hand, the negative half-wave rectifying circuit 13 half-wave rectifies only a negative pole in the sine wave signal "a" as shown in FIG. 2A and outputs a negative side rectified signal g as a second pulse train as shown in FIG. 2C.

The negative side rectified signal g which is outputted from this negative half-wave rectifying circuit 13 is applied to the other input terminal of the wave synthesizing circuit 15 as a delay rectified signal h as shown in FIG. 2D which is delayed by the delay time Th which is designated from the outside by a delay circuit 14.

Accordingly, the delay circuit 14 has a function for setting the phase difference between the first pulse train (the rectified signal in the positive side) and the second pulse train (the rectified signal in the negative side) which are outputted from the positive half-wave rectifying circuit 12.

This wave synthesizing circuit 15 synthesizes the positive side rectified signal e and the delay rectified signal h which are inputted from the respective input terminals of this wave synthesizing circuit 15, to transmit them to a next half-wave rectifying circuit 16 as a synthesized wave signal i as shown in FIG. 2E.

As shown in FIG. 2E, this synthesized wave signal i becomes "0" level at a time corresponding to the delay time Th within the period Ta in the sine wave signal "a". On the other hand, waveforms of this synthesized wave signal i include the positive pulse 18a and the negative pulse 18b at the other time.

Then, the half-wave rectifying circuit 16 half-wave rectifies the inputted synthesized wave signal i and outputs the pulse train signal j as shown in FIG. 2F which is obtained by extracting portions of positive pulses 18a of the synthesized wave signal i, to an output terminal 17.

Therefore, as shown in FIG. 2F, the positive pulse portion 18a having a pulse width Tj in the repeat period Ta only remains in this pulse train signal j.

As shown in FIG. 1, according to the pulse generator of the first embodiment which is configured in such a manner, the pulse train signal j having a high repeat frequency fA and a high duty ratio is obtained from the sine wave signal which is outputted from a sine wave signal generating circuit 11 by the combination of a plurality of receiving circuit including half-wave rectifying circuits 12, 13 and 16 and the delay circuit 14 and the wave synthesizing circuit 15.

In other words, according to the pulse generator of this embodiment, a circuit which cannot easily obtain a high frequency property, is not used as the voltage amplifier.

Figure 3A:
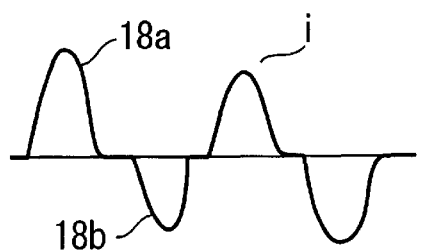
FIGS. 3A and 3B are diagrams for illustrating signal waveforms of synthesized wave signals in order to explain the operation of the pulse generator according to the first embodiment of the present invention.
Figure 3B:
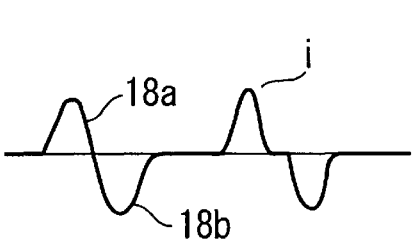

Further, according to the pulse generator of this embodiment, increasing the delay time Th set in the delay circuit 14 in the repeat period Ta enables a waveform of the synthesized wave signal i outputted from the wave synthesizing circuit 15 to be changed from the waveform having the positive pulse 18a and the negative pulse 18b as shown in FIG. 2E to a steep waveform as shown in FIGS. 3A and 3B.

Accordingly, changing the delay time Th which is set in the delay circuit 14 enables the pulse width Tj of the positive pulse 18a included in the outputted pulse train signal j to be arbitrarily set.

As a result, it is possible to continuously change the duty ratio of the outputted pulse train signal j from a low value to a high value.

Then, according to the pulse generator of this embodiment, it is possible to obtain the pulse train signal j having a high duty ratio with the high repeat frequency fA in the range from several GHz to 10 GHz and a sufficiently narrow pulse width Tj under the state that the jitter generating amount is restrained.

Second Embodiment

Figure 4:
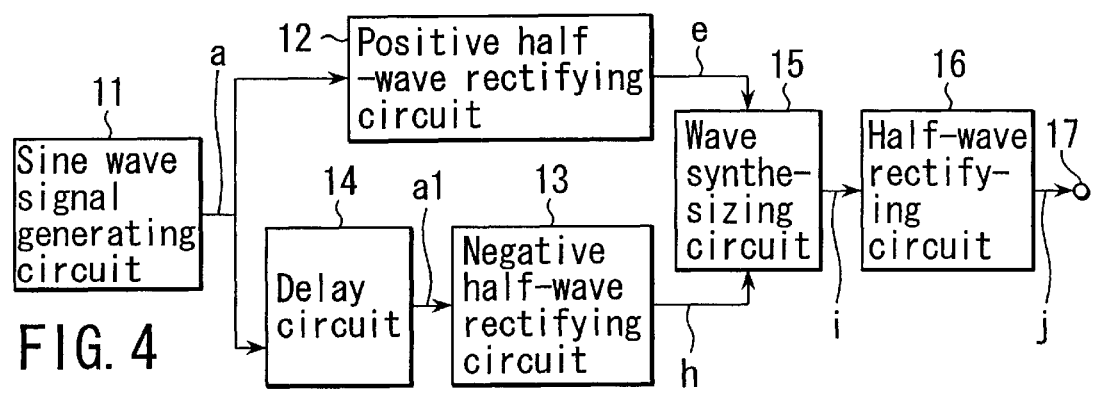
FIG. 4 is a block diagram for illustrating a schematic structure of a pulse generator according to a second embodiment of the present invention.

FIG. 4 is a block diagram for illustrating a schematic structure of a pulse generator according to a second embodiment of the present invention.

In FIG. 4, with respect to the identical parts as those in the pulse generator according to the first embodiment shown in FIG. 1, the identical reference numerals are given and the explanations thereof are omitted.

According to this pulse generator of the second embodiment, the negative half-wave rectifying circuit 13 and the delay circuit 14 are inversely arranged in the pulse generator according to the first embodiment shown in FIG. 1.

In other words, in the pulse generator as shown in FIG. 4, the sine wave signal "a" outputted from the sine wave signal generating circuit 11 as shown in FIG. 2A is inputted in the positive half-wave rectifying circuit 12 and the delay circuit 14.

The sine wave signal "a" which is inputted in the delay circuit 14 is inputted in the negative half-wave rectifying circuit 13 after being delayed by the delay time Th which is designated by this delay circuit 14.

The negative half-wave rectifying circuit 13 half-wave rectifies only the negative pole portion in the sine wave signal a1 which is delayed by the delay time Th to output it as a delay rectified signal h (the second pulse train after being delayed).

Accordingly, as a result, the delay circuit 14 has a function to set the phase difference between the first pulse train (rectified signal at the positive side) and the second pulse train, to be outputted from the half-wave rectifying circuit 12.

According to the pulse generator of the second embodiment which is configured in such a manner, the delay rectified signal h to be inputted in the wave synthesizing circuit 15 is identical with the delay rectified signal h in the pulse generator according to the first embodiment, so that it is possible to have an operational effect which is substantially the same as the operational effect of the pulse generator according to the first embodiment.

Further, in the pulse generator according to this second embodiment, the delay circuit 14 is arranged in a front stage of the negative half-wave rectifying circuit 13 and the sine wave signal "a" before being half-wave rectified is inputted in the delay circuit 14.

In this case, the frequency component of the sine wave signal "a" is lower than that of the half-wave rectified signal, so that it is possible to decrease the frequency property which is required by the delay circuit 14.

Third Embodiment

Figure 5:
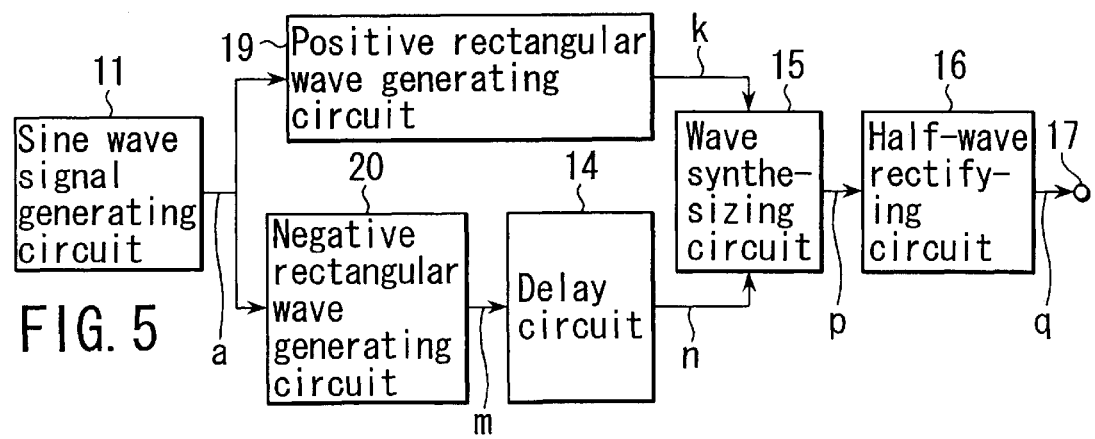
FIG. 5 is a block diagram for illustrating a schematic structure of a pulse generator according to a third embodiment of the present invention.

FIG. 5 is a block diagram for illustrating a schematic structure of a pulse generator according to a third embodiment of the present invention.

In FIG. 5, with respect to the identical parts as those in the pulse generator according to the first embodiment shown in FIG. 1, the identical reference numerals are given and the explanations thereof are omitted.

In the pulse generator shown according to the third embodiment, a positive rectangular wave generating circuit 19 is arranged in place of the half-wave rectifying circuit 12 as well as a negative rectangular wave generating circuit 20 is arranged in place of the negative half-wave rectifying circuit 13.

In the pulse generator shown in FIG. 5, the sine wave signal "a" having a frequency fA (a period Ta) outputted from the sine wave signal generating circuit 11 as shown in FIG. 6A is inputted in the positive rectangular wave generating circuit 19 and the negative rectangular wave generating circuit 20.

In this case, the positive rectangular wave generating circuit 19 outputs a positive side rectangular wave signal k as a first pulse train as shown in FIG. 6B having a positive predetermined value only for a positive pole portion in the sine wave. signal "a" as shown in FIG. 6A.

This positive side rectangular wave signal k outputted from the positive rectangular wave generating circuit 19 is applied to one input terminal of the wave synthesizing circuit 15.

On the other hand, the negative rectangular wave generating circuit 20 outputs a negative side rectangular wave signal m as a second pulse train as shown in FIG. 6C having a negative predetermined value only for a negative pole portion in the sine wave signal "a" as shown in FIG. 6A.

This negative side rectangular wave signal m outputted from the negative rectangular wave generating circuit 20 is applied to the other input terminal of the wave synthesizing circuit 15 as a delay rectangular wave signal n as shown in FIG. 6D which is delayed by the delay time Th designated from the outside, in the delay circuit 14.

This wave synthesizing circuit 15 synthesizes the positive side rectangular wave signal k and the negative side delay rectangular wave signal n which are inputted from the respective input terminals of this wave synthesizing circuit 15 to transmit them to a next half-wave rectifying circuit 16 as a synthesized wave signal p as shown in FIG. 6E.

As shown in FIG. 6E, this synthesized wave signal p becomes "0" level at a time corresponding to the delay time Th within the period Ta in the sine wave signal "a". On the other hand, waveforms of this synthesized wave signal p include the positive pulse 21a and the negative pulse 21b at the other time.

Then, the half-wave rectifying circuit 16 half-wave rectifies the inputted synthesized wave signal p and outputs a pulse train signal q as shown in FIG. 6F which is obtained by extracting positive portions of pulses 21a of the synthesized wave signal p to an output terminal 17.

Therefore, as shown in FIG. 6F, the positive pulse portion 21a having a pulse width Tj in the repeat period Ta only remains in this pulse train signal q.

According to the pulse generator of the third embodiment which is configured in this manner, the positive side rectangular wave signal k having only a positive side rectangular wave and the negative side rectangular wave signal m having only a negative side rectangular wave are generated from the sine wave signal "a" and the phase difference between them is regulated by the delay circuit 14, so that it is possible to set the pulse width Tj of the positive pulse 21a of the synchronized wave signal p to an arbitrary value.

Accordingly, it is possible to have a higher duty ratio in the pulse train signal q to be outputted from the output terminal 17.

Further, since the waveform of the positive pulse 21a in the pulse train signal q is a rectangular waveform, the pulse width Tj of the positive pulse 21a in the pulse train signal q is not changed, even if the value of the frequency fA of the sine wave signal "a" to be outputted from the sine wave signal generating circuit 11 is changed. Considering this inversely, it is possible to independently control the repeat frequency fA and the pulse width Tj of the pulse train signal q to be outputted.

Further, the rectangular wave generating circuits 19 and 20 can be configured by the combination of simple and-gates, however, it may be manufactured by combining SRD (step recovery diode).

Fourth Embodiment

Figure 7:
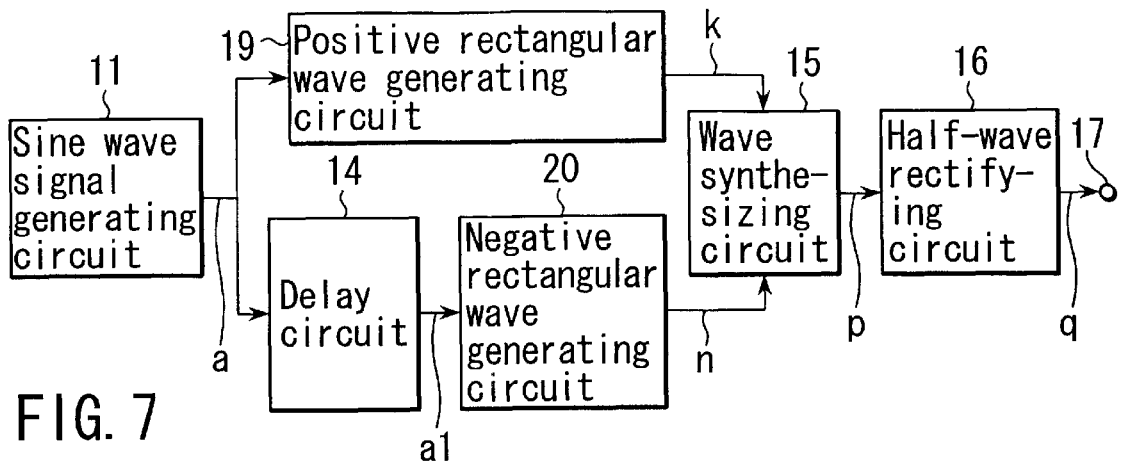
FIG. 7 is a block diagram for illustrating a schematic structure of a pulse generator according to a fourth embodiment of the present invention.

FIG. 7 is a block diagram for illustrating a schematic structure of a pulse generator according to a fourth embodiment of the present invention.

In FIG. 7, with respect to the identical parts as those in the pulse generator according to the third embodiment shown in FIG. 5, the identical reference numerals are given and the explanations thereof are omitted.

According to this pulse generator of the fourth embodiment, the negative rectangular wave generating circuit 20 and the delay circuit 14 are inversely arranged in the pulse generator according to the third embodiment shown in FIG. 5.

In other words, in the pulse generator as shown in FIG. 7, the sine wave signal "a" outputted from the sine wave signal generating circuit 11 as shown in FIG. 6A is inputted in the positive rectangular wave generating circuit 19 and the delay circuit 14.

In this case, the sine wave signal "a" which is inputted in the delay circuit 14 is inputted in the negative rectangular wave generating circuit 20 after being delayed by the delay time Th which is designated by this delay circuit 14.

The negative rectangular wave generating circuit 20 outputs this sine wave signal "a" as a delay rectangular wave signal n having a negative predetermined value only for the negative pole portion in the sine wave signal a1 which is delayed by the delay time Th (the second pulse train after being delayed).

Accordingly, consequently, the delay circuit 14 has a function to set the phase difference between the first pulse train and the second pulse train to be outputted from the positive rectangular wave generating circuit 19.

According to the pulse generator of the fourth embodiment which is configured in such a manner, the delay rectangular wave signal n to be inputted in the wave synthesizing circuit 15 is identical with the delay rectangular wave signal n in the pulse generator according to the third embodiment, so that it is possible to have an operational effect which is substantially same as the operational effect of the pulse generator according to the third embodiment.

Fifth Embodiment

Figure 8:
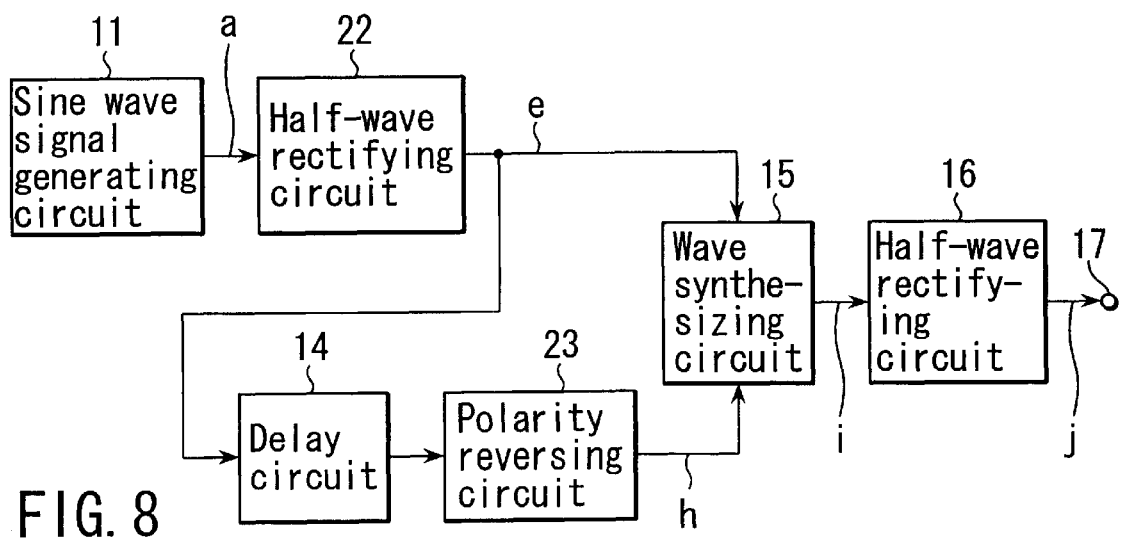
FIG. 8 is a block diagram for illustrating a schematic structure of a pulse generator according to a fifth embodiment of the present invention.

FIG. 8 is a block diagram for illustrating a schematic structure of a pulse generator according to a fifth embodiment of the present invention.

In FIG. 8, with respect to the identical parts as those in the pulse generator according to the first embodiment shown in FIG. 1, the identical reference numerals are given and the explanations thereof are omitted.

In the pulse generator according to the fifth embodiment as shown in FIG. 8, the sine wave signal "a" which is outputted from the sine wave signal generating circuit 11 as shown in FIG. 2A is half-wave rectified in a half-wave rectifying circuit 22 to be inputted in the wave synthesizing circuit 15 as the positive side rectified signal e (a first pulse train) as shown in FIG. 2B.

Further, the positive side rectified signal e outputted from the half-wave rectifying circuit 22 is delayed by the delay time (Ta/2+Th) comprising ½ of the period Ta of the sine wave signal "a" and the delay time Th designated from the outside by the delay circuit 14. Then, a polarity of the positive side rectified signal e which is outputted from the half-wave rectifying circuit 22 is reversed by a polarity reversing circuit 23 and the positive side rectified signal e is inputted in the wave synthesizing circuit 15 as the delay rectified signal h (a second pulse train which is delayed).

This wave synthesizing circuit 15 synthesizes the waveforms of the positive side rectified signal e and the delay rectified signal h which are outputted from the half-wave rectifying circuit 22 to transmit it to the half-wave rectifying circuit 16 as a synthesized wave signal i.

This half-wave rectifying circuit 16 half-wave rectifies the synthesized wave signal i to output it to the output terminal 17 as the pulse train signal j.

According to the pulse generator of the fifth embodiment which is configured in such a manner, first pulse generating means is configured by the half-wave rectifying circuit 22 and second pulse generating means is configured by the half-wave rectifying circuit 22, the delay circuit 14 and the polarity reversing circuit 23.

Accordingly, it is possible to have an operational effect which is substantially identical with that of the pulse generator according to the first and the second embodiments.

Sixth Embodiment

Figure 9:
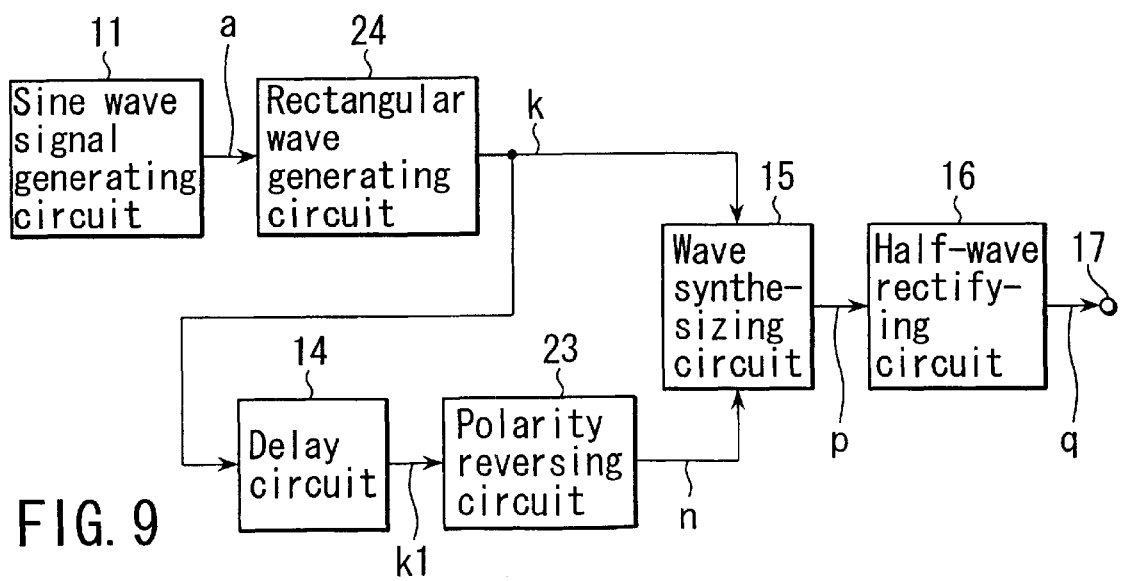
FIG. 9 is a block diagram for illustrating a schematic structure of a pulse generator according to a sixth embodiment of the present invention.
Figure 12:
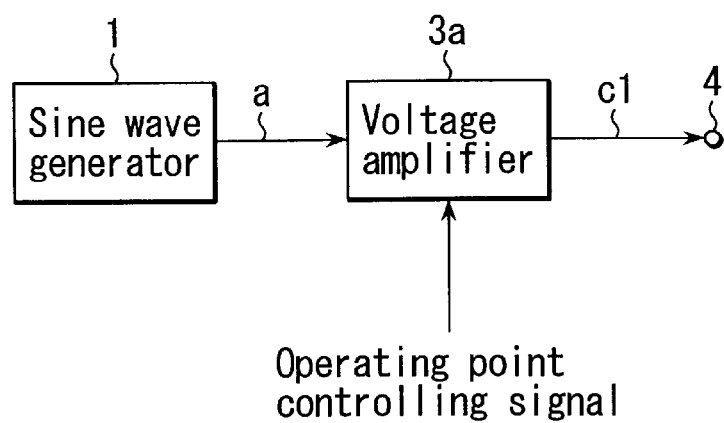
FIG. 12 is a block diagram for illustrating a schematic structure of other conventional pulse generator.
Figures 13A, 13B:
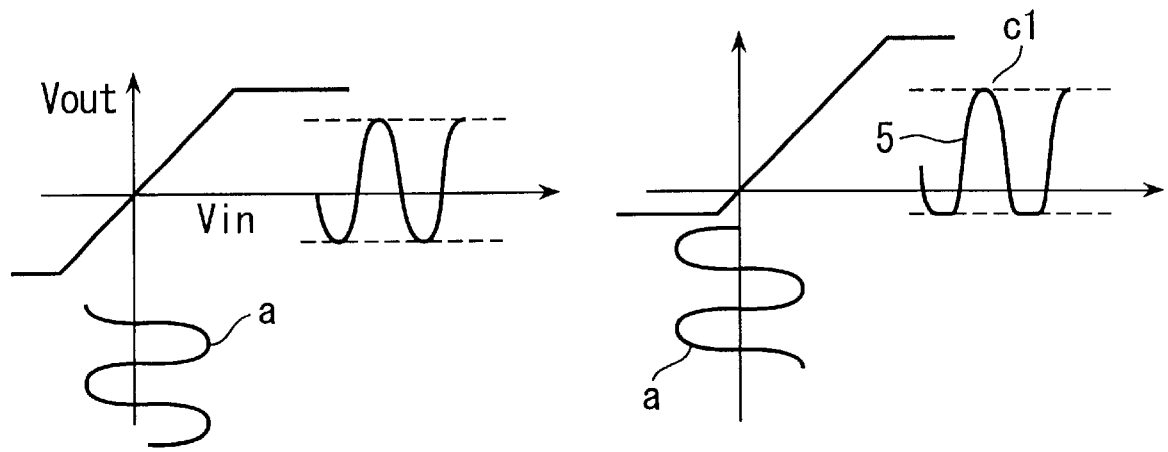
FIGS. 13A and 13B are drawings for illustrating the operation property of a voltage amplifier having a movable operating point which is incorporated in the other conventional pulse generator shown in FIG. 12.

FIG. 9 is a block diagram for illustrating a schematic structure of a pulse generator according to a sixth embodiment of the present invention.

In FIG. 9, with respect to the identical parts as those in the pulse generator according to the third embodiment shown in FIG. 5, the identical reference numerals are given and the explanations thereof are omitted.

In the pulse generator according to the sixth embodiment as shown in FIG. 9, the sine wave signal "a" which is outputted from the sine wave signal generating circuit 11 is half-wave rectified in a rectangular wave generating circuit 24 to be inputted in the wave synthesizing circuit 15 as the positive side rectangular wave signal k (a first pulse train) as shown in FIG. 6B.

Further, the positive side rectangular wave signal k outputted from the rectangular wave generating circuit 24 is delayed by the delay time (Ta/2+Th) comprising ½ of the period Ta of the sine wave signal "a" and the delay time Th designated from the outside by the delay circuit 14.

Then, a polarity of this delayed positive side rectangular wave signal k1 is reversed by the polarity reversing circuit 23 and the delayed positive side rectangular wave signal k1 is inputted in the wave synthesizing circuit 15 as the delay rectified signal n (a second pulse train which is delayed).

This wave synthesizing circuit 15 synthesizes the waveforms of the positive side rectangular wave signal k and the delay rectangular wave signal n which are outputted from the rectangular wave generating circuit 24 to transmit it to the half-wave rectifying circuit 16 as a synthesized wave signal p.

This half-wave rectifying circuit 16 half-wave rectifies the synthesized wave signal p to output it to the output terminal 17 as a pulse train signal q.

According to the pulse generator of the sixth embodiment which is configured in such a manner, first pulse generating means is configured by the rectangular wave generating circuit 24 and second pulse generating means is configured by the rectangular wave generating circuit 24, the delay circuit 14 and the polarity reversing circuit 23.

Accordingly, it is possible for the pulse generator according to the sixth embodiment to have an operational effect which is substantially identical with those of the pulse generators according to the third and the fourth embodiments as described above.

As explained above, according to the pulse generator of the present invention, it is possible to change the pulse width of the pulses included in one repeat frequency in a pulse train to be outputted by making a pair of pulse trains of which polarities are different each other from one electric signal in a sine waveform and regulating the phase difference between these pulse trains each other.

Accordingly, according to the pulse generator of the present invention, it is possible to generate a pulse train having a high repeat frequency and a high duty ratio by a simple configuration as well as it is possible to individually set this repeat frequency and the duty ration of this pulse train.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pulse generator comprising:
   signal generating means for generating an electric signal in a sine waveform;
   first pulse train generating means for generating a first pulse train having a positive polarity corresponding to the positive polarity element among a positive polarity element and a negative polarity element which configure the electric signal in the sine waveform outputted from said signal generating means;
   second pulse train generating means for generating a second pulse train having a negative polarity corresponding to the negative polarity element among a positive polarity element and a negative polarity element which configure the electric signal in the sine waveform outputted from said signal generating means;
   phase difference setting means for setting the phase difference between said first pulse train and said second pulse train so that a pulse of said first pulse train which is generated by said first pulse train generating means and a pulse of said second pulse train which is generated by said second pulse train generating means are partially superimposed temporally;
   wave synthesizing means for synthesizing said first pulse train and said second pulse train, in which the phase difference is set by said phase difference setting means; and
   half-wave rectifying means for half-wave rectifying the output from said wave synthesizing means and generating a pulse train having a pulse width narrower than any of the pulse widths owned by said first pulse train and said second pulse train.

2. A pulse generator according to claim 1, wherein said first pulse train generating means includes a positive half-wave rectifying circuit for half-wave rectifying only a positive pole in a sine wave signal which is outputted from said signal generating means, and outputting a positive side rectified signal as said first pulse train; and
   said second pulse train generating means includes a negative half-wave rectifying circuit for half-wave rectifying only a negative pole in a sine wave signal which is outputted from said signal generating means, and outputting a negative side rectified signal as said second pulse train.

3. A pulse generator according to claim 2, wherein said phase difference setting means includes a delay circuit which is inserted in a rear stage of said negative half-wave rectifying circuit, and said delay circuit delays said negative side rectified signal which is outputted from said negative half-wave rectifying circuit, by the delay time designated from the outside.

4. A pulse generator according to claim 2, wherein said phase difference setting means includes a delay circuit which is inserted in a front stage of said negative half-wave rectifying circuit, and said delay circuit delays said sine wave signal which is outputted from said signal generating means by the delay time designated from the outside to provide it to said negative half-wave rectifying circuit for outputting a negative side rectified signal as said second pulse train.

5. A pulse generator according to claim 1, wherein said first pulse train generating means includes a positive rectangular wave generating circuit for outputting a positive side rectangular wave signal as said first pulse train having a positive predetermined value only for a positive pole portion in a sine wave signal which is outputted from said signal generating means; and said second pulse train generating means includes a negative rectangular wave generating circuit for outputting a negative side rectangular wave signal as said second pulse train having a positive predetermined value only for a negative pole portion in a sine wave signal which is outputted from said signal generating means.

6. A pulse generator according to claim 5, wherein said phase difference setting means includes a delay circuit which is inserted in a rear stage of said negative rectangular wave generating circuit, and said delay circuit delays said negative side rectified signal which is outputted from said negative rectangular wave generating circuit, by the delay time designated from the outside.

7. A pulse generator according to claim 5, wherein said phase difference setting means includes a delay circuit which is inserted in a front stage of said negative rectangular wave generating circuit, and said delay circuit delays said sine wave signal which is outputted from said signal generating means by the delay time designated from the outside to provide it to said negative rectangular wave generating circuit for outputting a negative side rectangular wave signal as said second pulse train.

8. A pulse generator according to claim 1, wherein said first pulse train generating means includes a half-wave rectifying circuit for half-wave rectifying only a positive pole in said sine wave signal which is outputted from said signal generating means, and outputting a positive side rectified signal as said first pulse train; and said second pulse train generating means includes a polarity reversing circuit for reversing a polarity of said positive side rectified signal which is outputted from said half-wave rectifying circuit, and outputting a negative side rectified signal as said second pulse train.

9. A pulse generator according to claim 8, wherein said phase difference setting means includes a delay circuit which is inserted in a front stage of said polarity reversing circuit, and said delay circuit delays said positive side rectified signal which is outputted from said half-wave rectifying circuit by the delay time designated from the outside to provide it to said polarity reversing circuit for outputting a negative side rectified signal as said second pulse train.

10. A pulse generator according to claim 1, wherein said first pulse train generating means includes a rectangular wave generating circuit for outputting a positive side rectangular wave signal as said first pulse train having a positive predetermined value only for a positive pole portion in said sine wave signal which is outputted from said signal generating means; and said second pulse train generating means includes a polarity reversing circuit for reversing a polarity of said positive side rectangular wave signal which is outputted from said rectangular wave generating circuit, and outputting a negative side rectangular wave signal as said second pulse train.

11. A pulse generator according to claim 10, wherein said phase difference setting means includes a delay circuit which is inserted in a front stage of said rectangular wave generating circuit, and said delay circuit delays said positive side rectangular wave signal which is outputted from said rectangular wave generating circuit, by the delay time designated from the outside to provide it to said polarity reversing circuit for outputting a negative side rectangular wave signal as said second pulse train.

* * * * *